US011234516B2

(12) United States Patent
Meusburger

(10) Patent No.: US 11,234,516 B2
(45) Date of Patent: Feb. 1, 2022

(54) DRAWER PULL-OUT GUIDE

(71) Applicant: Julius Blum GmbH, Hoechst (AT)

(72) Inventor: Marc Meusburger, Egg (AT)

(73) Assignee: JULIUS BLUM GMBH, Hoechst (AT)

( * ) Notice: Subject to any disclaimer, the term of this patent is extended or adjusted under 35 U.S.C. 154(b) by 0 days.

(21) Appl. No.: 16/903,659

(22) Filed: Jun. 17, 2020

(65) Prior Publication Data

US 2020/0305600 A1 Oct. 1, 2020

Related U.S. Application Data

(63) Continuation of application No. PCT/AT2018/060300, filed on Dec. 13, 2018.

(30) Foreign Application Priority Data

Dec. 21, 2017 (AT) .............................. A 51064/2017

(51) Int. Cl.
*A47B 88/427* (2017.01)
*A47B 88/493* (2017.01)
(Continued)

(52) U.S. Cl.
CPC .......... *A47B 88/427* (2017.01); *A47B 88/437* (2017.01); *A47B 88/493* (2017.01);
(Continued)

(58) Field of Classification Search
CPC ... A47B 88/487; A47B 88/437; A47B 88/493; A47B 88/407; A47B 2210/0059
See application file for complete search history.

(56) References Cited

U.S. PATENT DOCUMENTS 3,716,279 A * 2/1973 Anderson ............ A47B 88/487 384/19
4,119,377 A * 10/1978 Barber ................. A47B 88/487 312/334.19

(Continued)

FOREIGN PATENT DOCUMENTS

CN 2529559 1/2003
CN 102137606 7/2011

(Continued)

OTHER PUBLICATIONS

International Search Report dated Jan. 25, 2019 in International (PCT) Application No. PCT/AT2018/060300.

(Continued)

*Primary Examiner* — Daniel J Rohrhoff
(74) *Attorney, Agent, or Firm* — Wenderoth, Lind & Ponack, L.L.P.

(57) ABSTRACT

A drawer pull-out guide including a first guide rail and a second guide rail displaceably supported relative to one another in a longitudinal direction of the guide rails between a closed position and an open position. A guide body is supported between the guide rails, and the guide rails are guidable relative to one another in a lateral direction in a mounted position of the drawer pull-out guide by the guide body. At least one of the guide rails includes a protrusion bearing against the guide body in the open position of the guide rails, so that at least in that region, in which the guide body and the protrusion bear against each other, the guide rails are arranged without clearance relative to one another in the lateral direction.

11 Claims, 4 Drawing Sheets

(51) Int. Cl.

*A47B 88/437* (2017.01)
*A47B 88/407* (2017.01)

(52) U.S. Cl.

CPC ..... *A47B 88/407* (2017.01); *A47B 2210/0054* (2013.01); *A47B 2210/0059* (2013.01); *E05Y 2900/20* (2013.01)

(56) References Cited

U.S. PATENT DOCUMENTS

| | | | | | |
|---|---|---|---|---|---|
| 4,315,661 | A * | 2/1982 | Kessler | A47B 88/487 | 312/334.19 |
| 4,919,548 | A * | 4/1990 | Lautenschlager | A47B 88/487 | 384/19 |
| 5,076,712 | A * | 12/1991 | Salice | A47B 88/487 | 384/19 |
| 5,209,572 | A * | 5/1993 | Jordan | A47B 88/493 | 312/334.7 |
| 8,201,901 | B2 | 6/2012 | Craddock | | |
| 8,911,038 | B2 | 12/2014 | Gmeiner | | |
| 2004/0145285 | A1* | 7/2004 | Hwang | A47B 88/493 | 312/333 |
| 2004/0227442 | A1* | 11/2004 | Huang | A47B 88/487 | 312/334.9 |
| 2010/0164341 | A1 | 7/2010 | Craddock | | |
| 2013/0058596 | A1* | 3/2013 | Chen | H05K 7/1489 | 384/7 |
| 2013/0257245 | A1 | 10/2013 | Gmeiner | | |
| 2018/0020832 | A1* | 1/2018 | Mason | A47B 88/493 | 312/334.1 |

FOREIGN PATENT DOCUMENTS

| | | |
|---|---|---|
| CN | 202714503 | 2/2013 |
| CN | 103228180 | 7/2013 |
| CN | 206518325 | 9/2017 |
| DE | 24 14 151 | 10/1975 |
| DE | 10 2016 125 028 | 6/2017 |
| EP | 1 321 094 | 6/2003 |
| EP | 1 323 372 | 7/2003 |
| JP | 2006-296720 | 11/2006 |
| JP | 2009-504218 | 2/2009 |
| WO | 88/05639 | 8/1988 |

OTHER PUBLICATIONS

English translation of Chinese Search Report dated Jun. 1, 2021 in Chinese Patent Application No. 201880082183.2.

* cited by examiner

DRAWER PULL-OUT GUIDE

BACKGROUND OF THE INVENTION

The present invention relates to a drawer pull-out guide, comprising a first guide rail and a second guide rail displaceably supported relative to one another in a longitudinal direction of the guide rails between a closed position and an open position. A guide body is supported between the guide rails, the guide rails being guidable in a lateral direction relative to one another in a mounted position of the drawer pull-out guide by the guide body.

With drawer pull-out guides, the lateral stability is a relevant quality criterion, and the lateral stability can usually be improved be specially formed guide rails and/or by running wheels for laterally guiding the guide rails. However, the lateral stability is significantly reduced the more the drawer is extended relative to a furniture carcass. In the fully extended condition of the drawer pull-out guide, leverage forces occur upon an application of force on the extended guide rail. These leverage forces intensify a lateral clearance between the guide rails or a tilting movement of the guide rails about an axis extending in the longitudinal direction of the guide rails. The lateral clearance of the extended drawer is additionally increased when the construction width of the drawer is increased. However, an undue lateral clearance of the drawer pull-out guide makes a rather poor impression to a person.

Measures for improving a lateral stability of receptacles are disclosed, for example, in EP 1 321 094 A1, EP 1 323 372 A2, U.S. Pat. Nos. 4,315,661 and 4,119,377.

SUMMARY OF THE INVENTION

It is an object of the present invention to propose a drawer pull-out guide of the type mentioned in the introductory part, avoiding the above-discussed drawbacks.

According to the invention, at least one of the guide rails includes at least one protrusion bearing against the at least one guide body in the open position of the guide rails, so that at least in that region, in which the guide body and the at least one protrusion bear against each other, the guide rails are arranged without clearance relative to one another in the lateral direction.

In other words, in the fully extended position of the drawer pull-out guide, at least one guide body supported between the guide rails bears against a protrusion of the guide rails, so that at least in that region, a lateral clearance between the guide rails is restrained due to the clearance-free abutment of the guide body on the protrusion.

The guide body can be supported either on one of the guide rails or, alternatively, on a running carriage arranged between the guide rails. However, two or more guide bodies can be provided, at least one first guide body being supported on one of the guide rails and at least one second guide body being supported on a running carriage displaceably supported between the guide rails, and each of the first guide body and the second guide body, in the extended condition of the drawer pull-put guide, is laterally supported on a protrusion of a guide rail.

Preferably, the guide body is configured so as to be rotationally symmetrical and is rotationally supported about an axis extending vertically in the mounted position. Basically, the guide body may also be configured as a non-pivotable supporting portion which, in the fully extended condition of the drawer pull-out guide, is configured to be supported without clearance on a protrusion of a guide rail.

With a constructive simple embodiment, the protrusion can be configured as an embossing on one of the guide rails. The protrusion can be produced by pressing an embossing stamp into a flat surface of a guide rail so as to be an integrally-formed component with the guide rail. Alternatively, it is possible that the protrusion is to be fixed to one of the guide rails, for example by screwing or bonding.

According to an embodiment of the invention, at least two guide bodies are supported between the guide rails, the guide bodies being spaced from one another in a longitudinal direction of the guide rails. In the open position of the guide rails, the first guide body bears without clearance against a first protrusion of the guide rails, and the second guide body bears without clearance against a second protrusion of the guide rails. Due to the at least two guide bodies being spaced from one another in the longitudinal direction and bearing against two protrusions spaced from one another in an open position of the drawer pull-out guide, the lateral clearance can be significantly reduced along a direction extending in the longitudinal direction of the guide rails.

According to an embodiment, the first guide body, upon a movement of the guide rails starting from the closed position into the open position, can be moved past the second protrusion, preferably by the formation of a gap, and that the first guide body, upon a continued movement of the guide rails in a direction of the open position, can be clampingly engaged with the first protrusion.

In this way, the occurring friction of the drawer pull-out guide is not increased, despite the stabilization, because the first guide body—upon opening the drawer pull-out guide—is initially moved past the second protrusion without contacting. Only in the fully open position of the drawer pull-out guide, the first guide body is in engagement with the first protrusion without clearance. In order to enable this function, the first protrusion and the second protrusion can have a different height. Alternatively, it is possible that the first protrusion and the second protrusion can have an identical height, and moving past the first guide body along the second protrusion can be enabled by a different thickness or by a different diameter of the guide bodies. As a further alternative, the first and the second protrusion can have an identical height, and the first and second guide body can be arranged so as to be laterally offset relative to one another in a direction extending transversely to the longitudinal direction of the guide rails.

BRIEF DESCRIPTION OF THE DRAWINGS

Further details and advantages of the present invention will be explained with the aid of the following description of figures, in which.

DETAILED DESCRIPTION OF THE INVENTION

Figure 1:
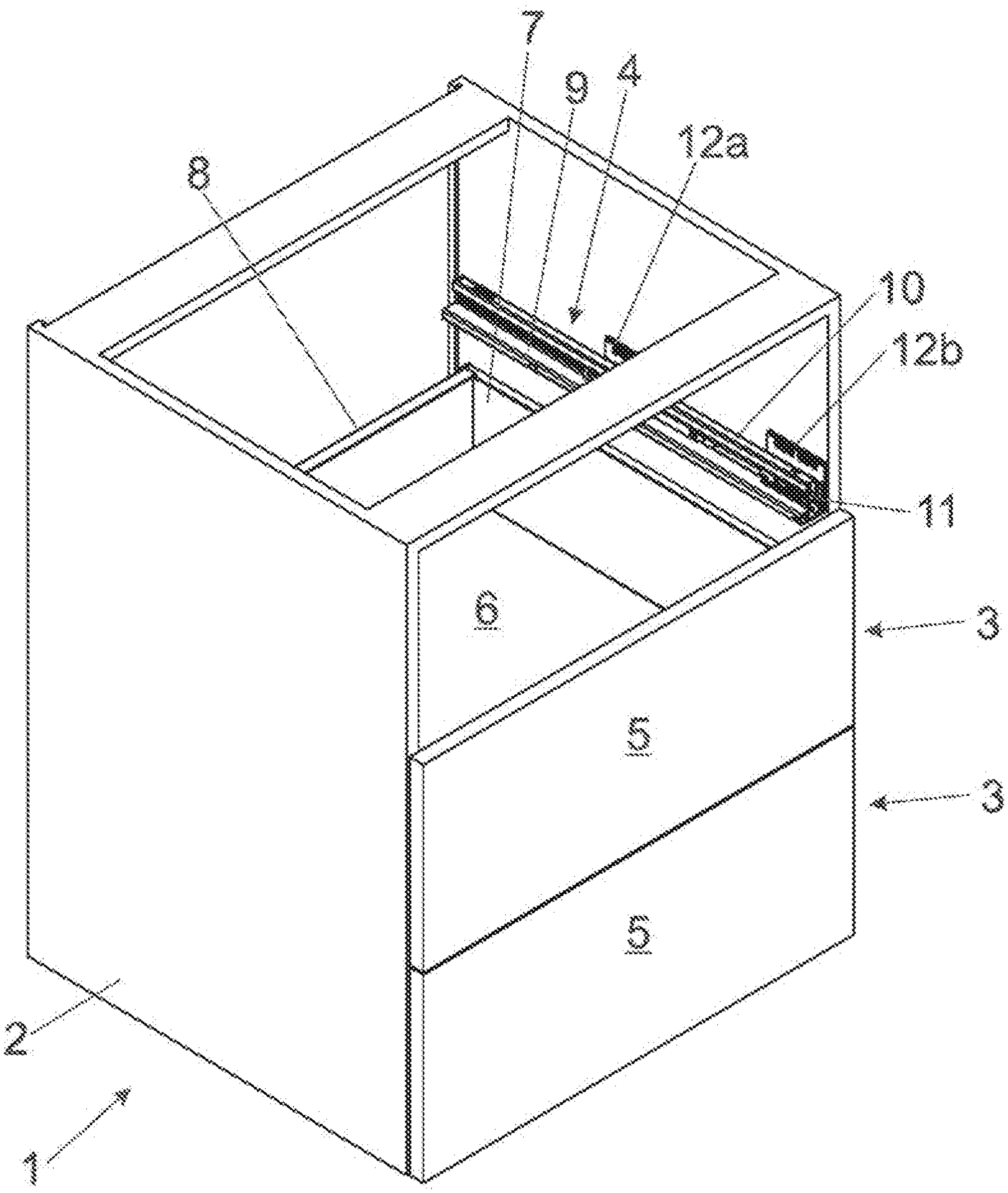
FIG. 1 is a perspective view of an item of furniture comprising a furniture carcass and drawers displaceably supported relative thereto.

FIG. 1 shows an item of furniture 1 having a cupboard-shaped furniture carcass 2, and drawers 3 are displaceably supported relative to the furniture carcass 2 by drawer pull-out guides 4. Each of the drawers 3 includes a front panel 5, a drawer bottom 6, drawer sidewalls 7 and a rear wall 8. Each of the drawer pull-out guides 4 includes a third guide rail 9 (i.e. a carcass rail) to be fixed to the furniture carcass 2 by fastening portions 12*a*, 12*b*, a second guide rail 10 (i.e. a drawer rail) displaceably supported relative to the third guide rail 9, the second guide rail 10 being connected or being configured to be connected to the drawer sidewall 7. The drawer pull-out guides 4 further includes a first guide rail 11 (i.e. a central rail) which, for realizing a full-extension of the drawer 3, is displaceably supported between the third guide rail 9 and the second guide rail 10.

Figure 2:
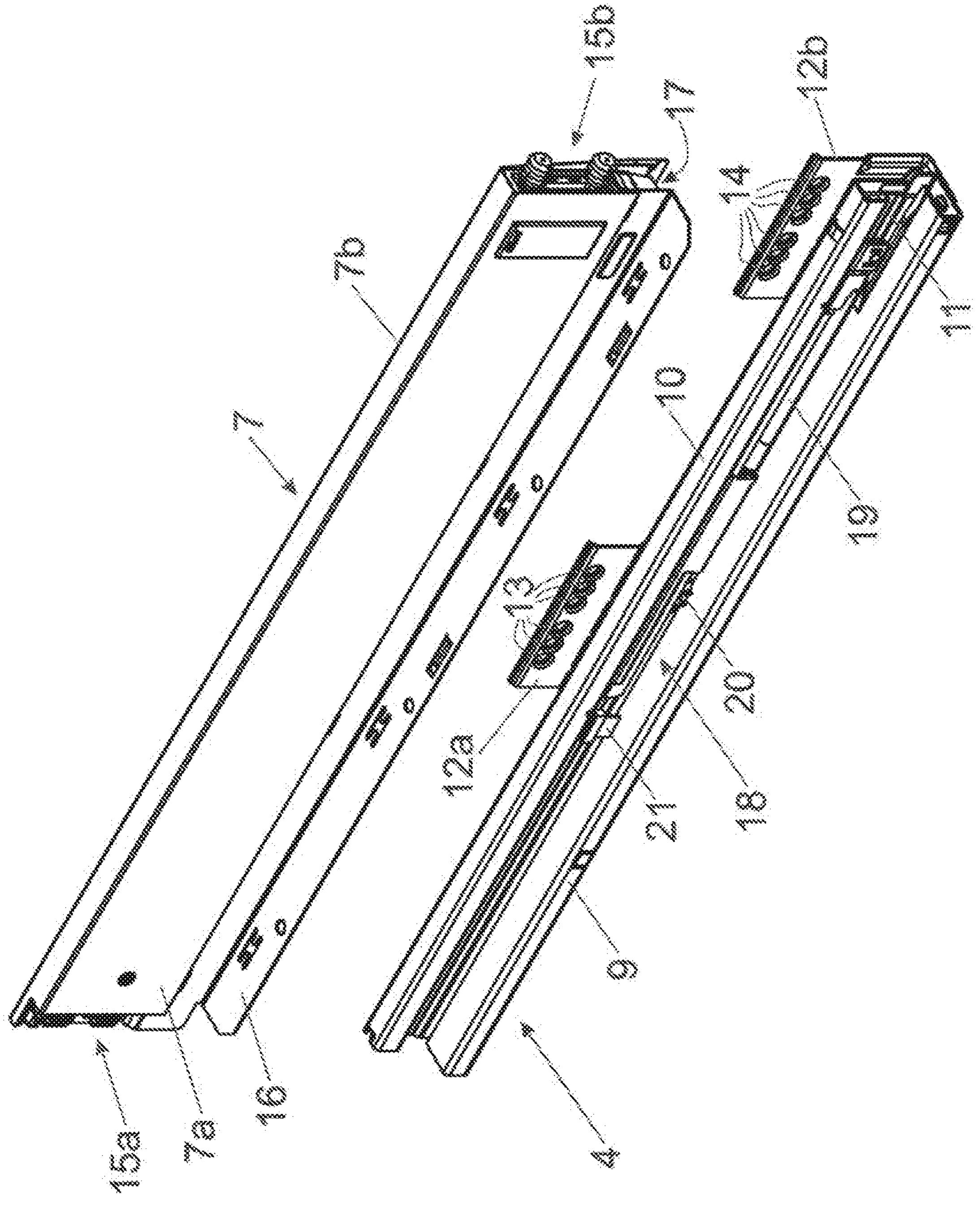
FIG. 2 shows a drawer pull-out guide having a second guide rail to be connected to a drawer sidewall.

FIG. 2 shows a perspective view of an arrangement comprising a drawer pull-out guide 4 and a drawer sidewall 7. The fastening portions 12*a*, 12*b* connected to the third guide rail 9 include one or a plurality of fastening locations 13, 14 for fixing to the furniture carcass 2. A displaceable first guide rail 11 is arranged between the third guide rail 9 and the second guide rail 10. A coupling element 21 is arranged on the second guide rail 10, the coupling element 21 being configured to be releasably coupled to an entrainment member 20 of a retraction device 18, so that the second guide rail 10, at the end of the closing movement, can be engaged by the entrainment member 20 and can be retracted into a closed end position by a force storage member of the retraction device 18. By a damping device 19, preferably having a hydraulic piston-cylinder-unit, the spring-assisted retraction movement of the second guide rail 10 can be decelerated until reaching the closed end position.

The drawer sidewall 7 is configured as a hollow-chamber profile having an inner profiled wall 7*a* and an outer profiled wall 7*b* spaced from the inner profiled wall 7*a*. The drawer sidewall 7 forms a channel 17 configured to be open towards the bottom and extending in a longitudinal direction of the drawer sidewall 7, so that the second guide rail 10 of the drawer pull-out guide 4 can be arranged in the channel 17. The drawer sidewall 7 further includes a first fastening device 15*a* for connecting to the rear wall 8, a second fastening device 15*b* for connecting to the front panel 5, and a support portion 16 for supporting the drawer bottom 6.

Figures 3A, 3B, 3C:
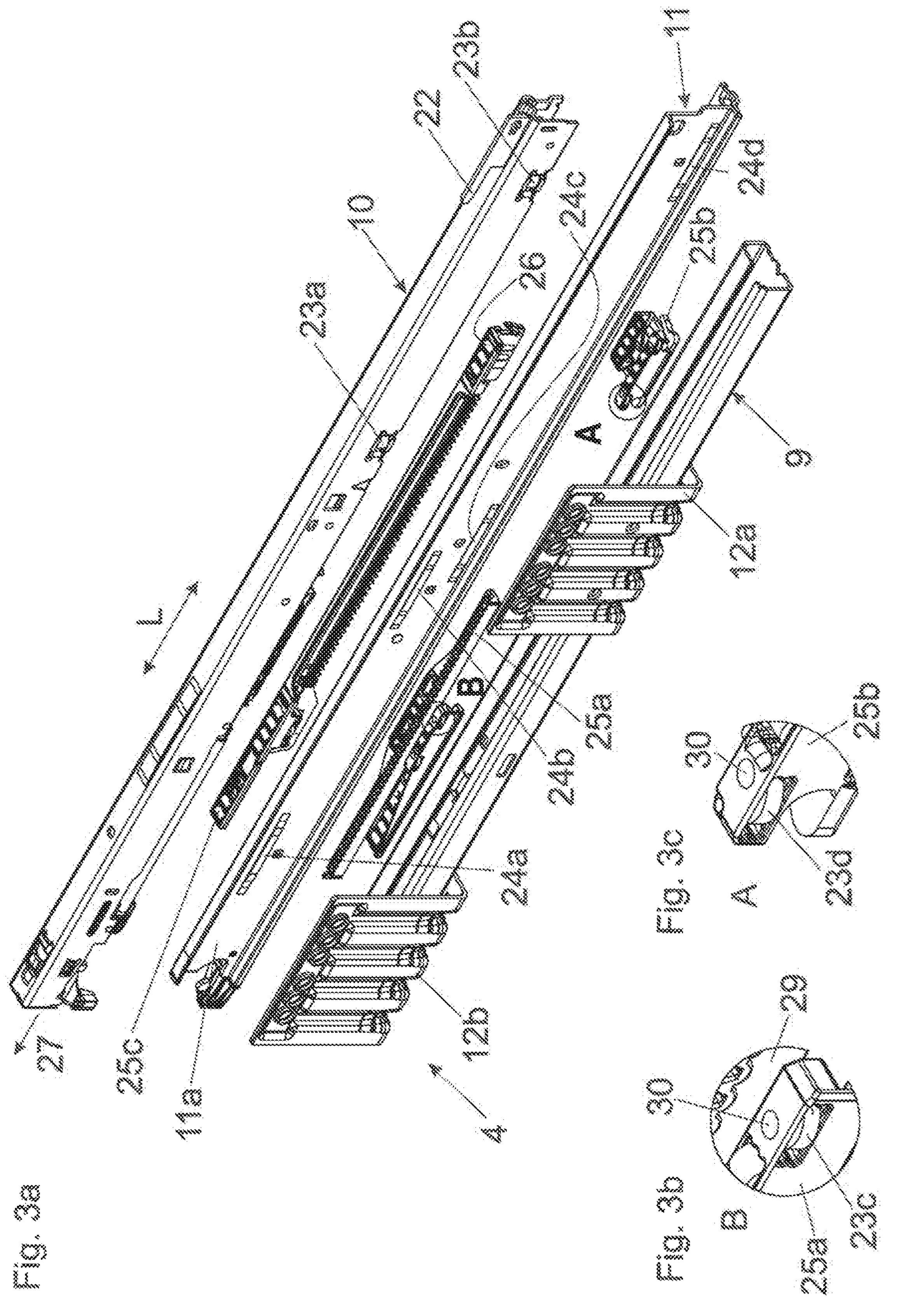
FIG. 3*a*-3*c* show the drawer pull-out guides in an exploded view and two enlarged detail views thereof.

FIG. 3*a* shows the drawer pull-out guide 4 in an exploded view. The third guide rail 9 is to be fixed to the furniture carcass 2 by the fastening portions 12*a*, 12*b*. The third guide rail 9 includes a substantially U-shaped or C-shaped portion in which a first running carriage 25*a* and a second running carriage 25*b* are supported for controlling a movement of the drawer pull-out guide 4. The second guide rail 10, on the rear end, has a hook portion 22 configured to be received in a bore of the rear wall 8 in a mounted position, thereby preventing a displacement of the drawer 3 in the longitudinal direction (L) and in a direction extending transversely to the longitudinal direction (L). A displaceable first rail 11 is provided between the third guide rail 9 and the second guide rail 10, and a third running carriage 25*c* is configured to be displaceable between the first guide rail 11 and the second guide rail 10. The third running carriage 25*c* is movement-coupled to the first running carriage 25*a*, for example by a gear rotatably supported on the first guide rail 11. Each of the running carriages 25*a*, 25*b*, 25*c* includes a plurality of rolling bodies 26 spaced from one another in the longitudinal direction (L), the rolling bodies 26 having a horizontal rotational axis.

In the shown embodiment, the second guide rail 10 includes at least one guide body 23*a* which is supported—in relation to the longitudinal direction (L) of the guide rail 10—in a rear half of the second guide rail 10. The at least one guide body 23*a* is configured so as to be rotationally symmetrical and is rotationally supported about an axis 30 extending vertically in the mounted position. The first guide rail 11 includes a, preferably vertically extending, side limb 11*a* on which at least one protrusion 24*a* (for example in the form of an embossing) is arranged. Upon a movement of the second guide rail 10 in the direction 27 of the open position, the at least one guide body 23*a* reaches the protrusion 24*a* and bears without clearance against the first protrusion 24*a* in the open position. In this way, at least in that region in which the at least one guide body 23*a* and the at least one protrusion 24*a* bear against each other, the guide rails 10, 11 are arranged without clearance relative to one another in a lateral direction extending transversely to the longitudinal direction (L). In the shown figure, two guide bodies 23*a*, 23*b* in the form of rollers are provided on the second guide rail 10, the guide bodies 23*a*, 23*b* being spaced from one another in the longitudinal direction (L) and each being supported about a vertically extending rotational axis in the mounted position. In the fully open position of the drawer pull-out guide 4, the first guide body 23*a* bears against the first protrusion 24*a* and the second guide body 23*b* bears against the second protrusion 24*b* in a play-free manner. Therefore, the lateral clearance between the guide rails 10, 11 can be reduced in a direction extending transversely to the longitudinal direction (L) of the guide rails 10, 11.

The protrusions 24*a*, 24*b* are configured so as to protrude from the side limb 11*a* of the first guide rail 11 in a lateral direction and are spaced from one another in the longitudinal direction (L) of the guide rails 9, 10, 11, for example in a front half of the first guide rail 11. Each of the protrusions 24*a*, 24*b* can include two ramps 31*a*, 31*b* (see FIG. 4*b*, FIG. 4*c*) spaced from one another in the longitudinal direction (L), so that the guide bodies 23*a*, 23*b* of the second guide rail 10 can run onto the protrusions 24*a*, 24*b* and can again run off from the protrusions 24*a*, 24*b* without a disturbing abutting edge.

According to an embodiment, the first protrusion 24*a* can have a larger height than the second protrusion 24*b*. In this way, the first guide body 23*a*, upon a movement of the second guide rail 10 starting from the closed position, can be moved past the second protrusion 24*b* having the lower height without interference from the second protrusion 24*b*, preferably by the formation of a gap. Subsequently, the first guide body 23*a* can be brought into engagement without clearance with the first protrusion 24*a* in the open position. Likewise, the second guide body 23*b* comes into engagement without clearance with the second protrusion 24*b* in the open position of the second guide rail 10 (for example due to a larger diameter of the second guide body 23*b* and/or due to an arrangement of the second guide body 23*b* being offset in a direction extending transversely to the longitudinal direction (L) relative to the first guide body 23*a*).

Moreover, a third protrusion 24*c* and a fourth protrusion 24*d* are further arranged on the first guide rail 11. The third protrusion 24*c* and the fourth protrusion 24*d* are spaced from each other in the longitudinal direction (L) and are arranged so as to be offset in the longitudinal direction (L) in relation to the first and second protrusions 24*a*, 24*b*. Each of the third and fourth protrusions 24*c*, 24*d* are provided to contact a guide body 23*c*, 23*d* arranged on the running carriages 25*a*, 25*b* without clearance. Accordingly, the lateral play between the third guide rail 9 and the first guide rail 11 can be reduced.

FIG. 3*b* shows the encircled region "A" of FIG. 3*a* in an enlarged view. The guide body 23*c* arranged on the running carriage 25*a* is pivotally mounted about an axis 30 extending vertically in the mounted position and bears against the third protrusion 24*c* of the first guide rail 11 in a play-free manner when the drawer pull-out guide 4 is located in the fully open position. The running carriage 25*a* includes a slit 29 for receiving the side limb 11*a* of the first guide rail 11.

FIG. 3*c* shows the encircled region "B" of FIG. 3*a* in an enlarged view. The guide body 23*d* arranged on the running carriage 25*b* is also pivotally mounted about an axis 30 extending vertically in the mounted position and bears against the fourth protrusion 24*d* of the first guide rail 11 in a play-free manner when the drawer pull-out guide 4 is located in the fully open position.

Figure 4A:
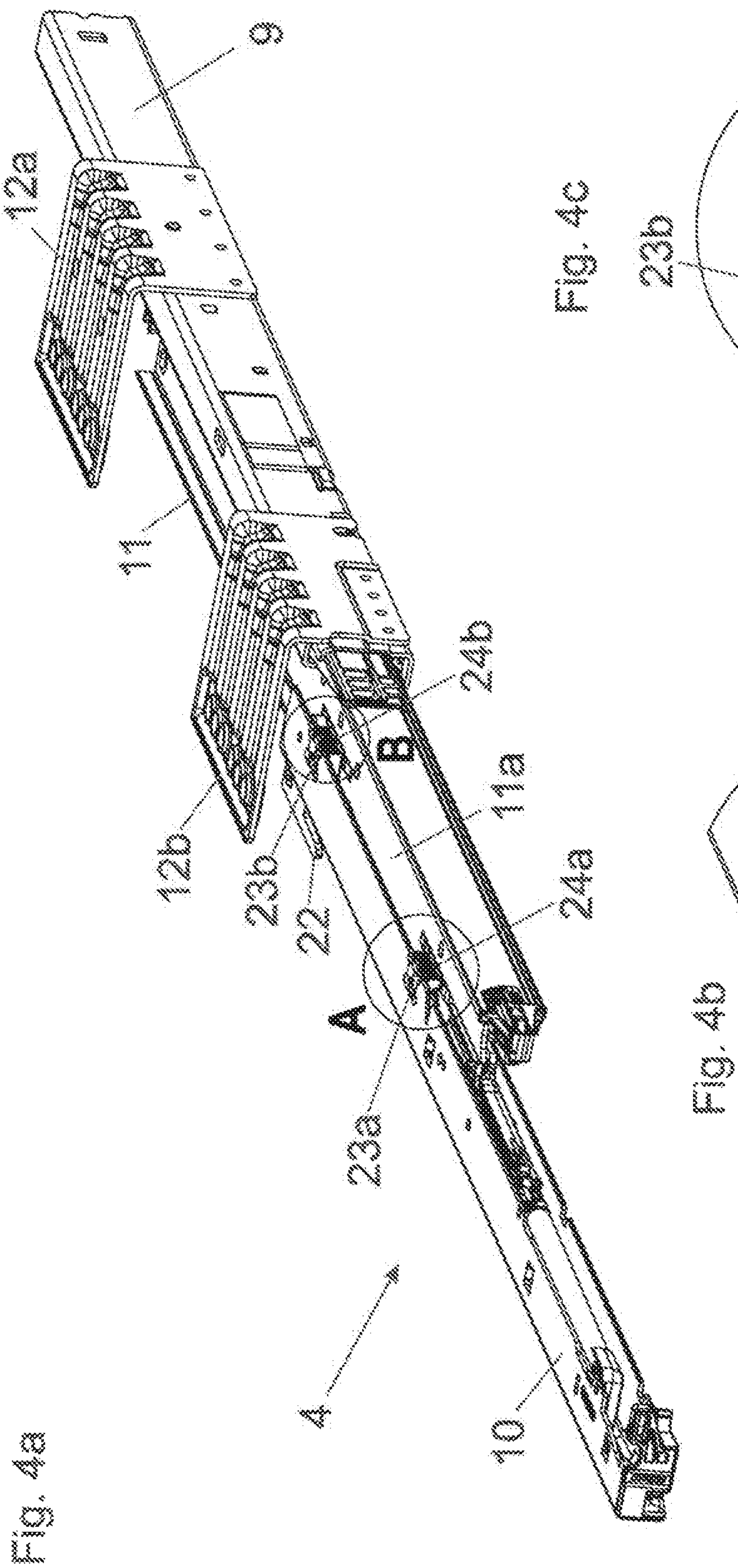
FIG. 4*a*-4*c* show the drawer pull-out guide in a lying position and two enlarged detail views thereof.

FIG. 4*a* shows the drawer pull-out guide 4 in a lying position, and the drawer pull-out guide 4 is located in the fully open position and each of the first and second guide bodies 23*a*, 23*b* bearing against their associated protrusions 24*a*, 24*b* in a play-free manner so as to restrain a lateral clearance between the first guide rail 11 and the second guide rail 10. In the open position, the third guide rail 9 and second guide rail 10 overlap one another in a region, and the first guide body 23*a* and the second guide body 23*b* are arranged within that region.

Figure 4C:
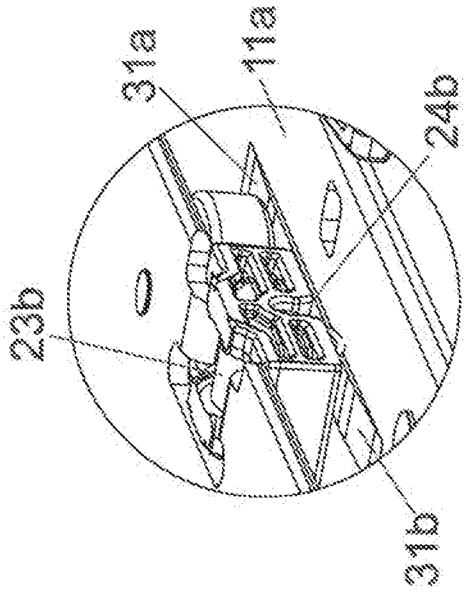
Figure 4B:
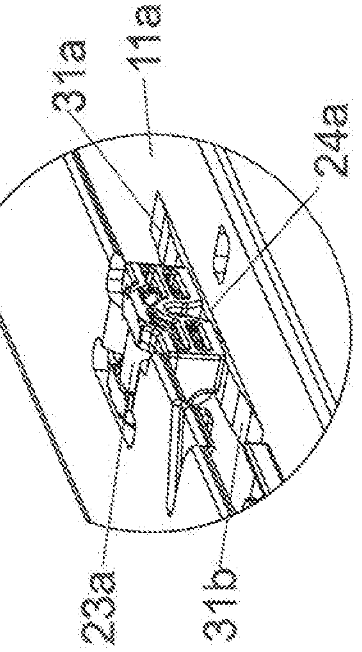

FIG. 4*b* shows the encircled region "A" of FIG. 4*a* in an enlarged view. The first guide body 23*a* bears without clearance against the first protrusion 24*a* when the second guide rail 10 is in the open position. The protrusion 24*a* may include at least one ramp 31*a*, 31*b* so as to facilitate a movement of the guide body 23*a* to and from the protrusion 24*a*. FIG. 4*c* shows the encircled region "B" of FIG. 4*a* in an enlarged view, in which the second guide body 23*b* bears without clearance against the second protrusion 24*b* when the drawer pull-out guide 4 is located in the open position.

The drawer pull-out guide 4 can thus include at least three guide rails 9, 10, 11 configured to be displaceable relative to one another, as shown in the figures. The third guide rail 9 is to be fixed to a furniture carcass 2, the second guide rail 10 is to be fixed to a drawer 3, and the first guide rail 11 is configured to be displaceable between the third guide rail 9 and the second guide rail 10. Thereby, at least one guide body 23*a*, 23*b*, 23*c*, 23*d* can be arranged between the third guide rail 9 and the first guide rail 11, and at least one further guide body 23*a*, 23*b*, 23*c*, 23*d* can be arranged between the first guide rail 11 and the second guide rail 10.

The invention claimed is:

1. A drawer pull-out guide, comprising:

guide rails including a first guide rail and a second guide rail displaceably supported relative to one another in a longitudinal direction of the guide rails between a closed position and an open position; and guide body supported between the guide rails, the guide rails being guidable in a lateral direction relative to one another in a mounted position of the drawer pull-out guide by the guide body, the guide body being rotationally symmetrical and rotatably mounted about an axis extending vertically in the mounted position, wherein at least one of the guide rails includes a protrusion bearing against the guide body in an open position of the guide rails, so that in a region in which the guide body and the the protrusion bear against each other, the guide rails are arranged without clearance relative to one another in the lateral direction.

2. The drawer pull-out guide according to claim 1, wherein the guide body is supported on one of the guide rails or on a running carriage arranged between the guide rails.

3. The drawer pull-out guide according to claim 1, wherein the protrusion is in the form of an embossing arranged on one of the guide rails.

4. The drawer pull-out guide according to claim 1, wherein the guide body is supported in a rear half of one of the guide rails with respect to the longitudinal direction of the guide rails.

5. An item of furniture comprising:

a furniture carcass;

a drawer displaceably supported relative to the furniture carcass; and the drawer pull-out guide according to claim 1 for allowing displacement of the drawer relative to the furniture carcass.

6. A drawer pull-out guide, comprising:

guide rails including a first guide rail and a second guide rail displaceably supported relative to one another in a longitudinal direction of the guide rails between a closed position and an open position; and at least two guide bodies supported between the guide rails, the guide rails being guidable in a lateral direction relative to one another in a mounted position of the drawer pull-out guide by the guide bodies, wherein the guide rails include protrusions configured to bear against the guide bodies in an open position of the guide rails, so that in a region in which the guide bodies and the protrusions bear against each other, the guide rails are arranged without clearance relative to one another in the lateral direction, and wherein the guide bodies are spaced from one another in the longitudinal direction of the guide rails, and a first one of the guide bodies bears against a first one of the protrusions of the guide rails without clearance and a second one of the guide bodies bears against a second one of the protrusions of the guide rails without clearance when the guide rails are located in the open position.

7. The drawer pull-out guide according to claim 6, wherein the first one of the protrusions and the second one of the protrusions have different heights.

8. The drawer pull-out guide according to claim 6, wherein the first one of the guide bodies is configured, upon a movement of the guide rails starting from the closed position to the open position, to be moved past the second one of the protrusions, and the first one of the guide bodies is further configured, upon a continued movement of the guide rails in a direction of the open position, to be engaged with the first one of the protrusions without clearance.

9. The drawer pull-out guide according to claim 8, wherein the first one of the at guide bodies is configured to be moved past the second one of the protrusions by the formation of a gap.

10. The drawer pull-out guide according to claim 6, wherein the guide rails, in the open position, overlap one another in a region, and the first one of the guide bodies and the second one of the guide bodies are arranged within that region.

11. A drawer pull-out guide, comprising:

at least three guide rails including a first guide rail, a second guide rail, and a third guide rail displaceably supported relative to one another in a longitudinal direction of the guide rails between a closed position and an open position; and at least two guide bodies supported between a respective pair of the guide rails, the guide rails being guidable in a lateral direction relative to one another in a mounted position of the drawer pull-out guide by the guide bodies;

wherein at least one of the guide rails includes a protrusion bearing against a respective one of the guide bodies in an open position of the guide rails, so that in a region in which the respective one of the guide bodies and the protrusion bear against each other, the guide rails are arranged without clearance relative to one another in the lateral direction, wherein the third guide rail is to be fixed to a furniture carcass, the second guide rail is to be fixed to a drawer, and the first guide rail is displaceably supported between the third guide rail and the second guide rail, and wherein a first one of the at least two guide bodies is supported between the third guide rail and the first guide rail, and a second one of the at least two guide bodies is supported between the first guide rail and the second guide rail.

* * * * *